United States Patent [19]
Suzuki et al.

[11] Patent Number: 5,151,764
[45] Date of Patent: Sep. 29, 1992

[54] SEMICONDUCTOR DEVICE

[75] Inventors: Yasutoshi Suzuki, Okazaki; Namoi Awano, Nagoya; Kouichi Hoshino, Oobu; Hajime Inuzuka, Nishio, all of Japan

[73] Assignee: Nippondenso Co., Ltd., Kariya, Japan

[21] Appl. No.: 592,487

[22] Filed: Oct. 4, 1990

[30] Foreign Application Priority Data

Oct. 5, 1989 [JP] Japan .................. 1-260991

[51] Int. Cl.⁵ ............ H01L 27/27; H01L 29/82; H01L 29/96; H01L 43/00
[52] U.S. Cl. ................................. 357/27; 357/41; 357/60
[58] Field of Search ................. 357/27, 41, 60

[56] References Cited

U.S. PATENT DOCUMENTS

| | | | |
|---|---|---|---|
| 4,315,273 | 2/1982 | Yamamoto et al. | 357/27 |
| 4,774,205 | 9/1988 | Choi et al. | 437/59 |
| 4,826,784 | 5/1989 | Salerno et al. | 437/89 |
| 4,875,011 | 10/1989 | Namiki et al. | 357/27 |

OTHER PUBLICATIONS

National Technical Report "GaSa Hall Sensors", Section 3.1, p. 133.

Technical Literature Electronic View, pp. 32-35.

*Primary Examiner*—Andrew J. James
*Assistant Examiner*—Sara W. Crane
*Attorney, Agent, or Firm*—Cushman, Darby & Cushman

[57] ABSTRACT

A Group III and V element compound semiconductor such as gallium arsenide is formed on a semiconductor wafer by so-called MOCVD. A first pair of convex portions, a second pair of convex portions and crossing portion are formed from such compound semiconductor by an etching using a predetermined etching substance so that one convex portion of each pair is opposite to the other convex portion thereof and that a same crystalline surface of the crossing portion is exposed at all points where the first pair of convex portions crosses the second pair of convex portions. A pair of input terminals and a pair of output terminals are electrically connected to each convex portion of the first pair and the second pair, respectively so as to input electric current to each convex portion of the first pair and to output voltage generated in response to a magnetic field strength in such compound semiconductor. Accordingly, the occurrence of the unbalanced voltage is prevented because of the geometrical balance of two pair convex portions and crossing portion.

13 Claims, 8 Drawing Sheets $l/s = 2.3$, $w'/w = 1.1$ $l/s = 2.3$, $w'/w = 1.6$

SEMICONDUCTOR DEVICE

BACKGROUND OF THE INVENTION

This invention relates to both a semiconductor device for detecting a strength of a magnetic field and a producing method thereof, and more particularly a Group III and V element compound semiconductor layer formed on a single element semiconductor wafer such as silicon wafer.

It is well known that a Group III and V element compound semiconductor such as gallium arsenide GaAs is used in diversified devices including Hall-effect devices, high-performance transistors, laser diodes, light-emitting diodes, photo-transistors, photo-diodes and solar cells because of the high-mobility, the direct-transition band structure and the variable character regarding its band gap and lattice.

However, according to the conventional skill, since it is not easy to manufacture a single crystal gallium arsenide device having a large diameter, it is difficult to integrate the gallium arsenide device and other circuits into a gallium arsenide wafer. This has lead to a high production cost.

For the above-mentioned problem, another approach is proposed by the present applicant (PCT Application No. JP89/0049; U.S. filing date Mar. 29, 1990). Namely, it relates to a composite integrated circuit which includes a Hall-effect element formed of gallium arsenide formed on a silicon wafer together with other circuits.

However, the research conducted by the inventors of the present invention have determined a problem about such hetero-epitaxial growth of gallium arsenide on the silicon wafer.

Specifically, hetero-epitaxial growth of gallium arsenide is done on a silicon wafer by using a metal organic chemical vapor deposition, so-called MOCVD. The gallium arsenide layer is then etched with photolithography by tartaric acid or another etching fluid such as sulfuric acid. In this etching process, the inventors of the present invention noticed that the shape of the gallium arsenide layer becomes asymmetric due to an etching velocity anisotropy of the etching fluid. This geometrical unbalance of the gallium arsenide layer is believed to result in an unbalanced voltage.

SUMMARY OF THE INVENTION

An object of the present invention is to provide a device including a Group III and V element compound semiconductor epitaxially formed on a semiconductor wafer in a way that the configuration of the compound semiconductor prevents this unbalanced voltage from occurring.

Another object of the present invention is to provide a method for forming a Group III and V element compound semiconductor on a semiconductor wafer in a way that such method prevents the unbalanced voltage from occurring.

According to the present invention, the semiconductor device for detecting magnetic field strength comprises a semiconductor wafer and an active layer of a Group III and V element compound semiconductor formed on the semiconductor wafer. The active layer is etched by using a predetermined etching substance so as to form two pairs of convex portions and a crossing portion. First and second pairs of convex portions are formed from said active layer so that one convex portion of each pair is opposite to the other convex portion thereof and that the first pair of convex portions crosses the second pair of convex portions. The crossing portion is formed so that a same crystalline surface thereof is exposed at all points where the first pair of convex portion crosses the second convex portion. Each convex portion of said first pair is electrically connected to a pair of input terminals so as to input an electric current to each convex portion of said first pair, and each convex portion of the second pair is electrically connected to a pair of output terminals so as to output a voltage generated in the active layer in response to a magnetic field strength.

In addition to the above-described device, the present invention provides the following method for producing such device.

The method of producing a semiconductor device for detecting a strength of magnetic field comprises the following steps.

In a first step, a semiconductor wafer is formed. In a second step, an active layer of a Group III and V element compound semiconductor is formed on the semiconductor wafer. In a third step, a first pair of convex portions, a second pair of convex portions and a crossing portion are formed from the active layer by an etching using a predetermined etching substance so that one convex portion of each pair is opposite to the other convex portion thereof and that a same crystalline surface of the crossing portion is exposed at all points where said first pair of convex portions crosses said second convex portions. Finally, a pair of input terminals and a pair of output terminals are electrically connected to each convex portion of the first pair and the second pair, respectively so as to input electric current to each convex portion of the first pair and to output voltage generated in the active layer in response to a magnetic field strength.

According to the present invention, since the shape of an active layer for detecting the strength of magnetic field is formed so as to have a geometrical balance, the occurrence of the unbalanced voltage is prevented.

BRIEF DESCRIPTION OF THE DRAWINGS

These and other aspects of the invention will now be described in detail with reference to the accompanying drawings, wherein.

DETAILED DESCRIPTION OF THE PREFERRED EMBODIMENT

A structure of Hall-effect portion 10, according to the present invention, will be explained in the order of its manufacturing process with reference to FIGS. 1 and 2.

Figure 2:
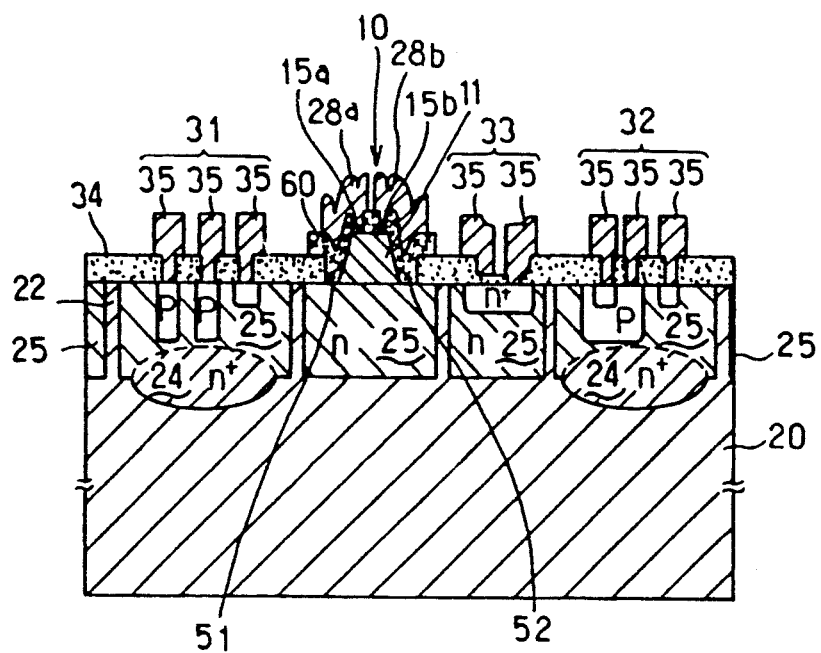
FIG. 2 is a sectional view showing a complete structure of a Hall-effect device illustrated in FIG. 1.

FIG. 2 shows using imbedding diffusion, to form n imbedded layer 24 onto a p-type silicon wafer 20 which has a specific resistance of 10–20 Ω·cm and a face-orientation (100) and inclined $4°\pm 1°$ to the orientation (011). An n-type silicon 25 is epitaxially formed on p-type wafer 20, and a p-type impurity 22 is partially diffused in epitaxial layer 25 of the n-type silicon.

Thereafter, according to a producing device, n-type impurity is diffused in n-type silicon layer 25 in order to form pnp-transistor 31, npn-transistor 32 and MOS capacitor 33. In FIG. 2, numerical 34 denotes a protection film of $SiO_2$. After the $SiO_2$ protection film is removed so as to expose the surface of the silicon wafer 20, a gallium arsenide is epitaxially formed on the (100) surface of silicon layer 25 by metal organic chemical vapor deposition (MOCVD). In this MOCVD, trimethyl gallium (TMG, $Ga(CH_3)_3$) or arsine ($AsH_3$) is used as the material gas and $SiH_4$ and DEZ n, both of which are diluted by hydrogen, are used as the n-type and p-type dopants, respectively. The flow rate of the gas is controlled by a flow rate controller so that a constant growing rate (e.g. 4.6 μm/h) of the gallium arsenide is maintained at a growing temperature of 750° C. In this case, at first, a buffer layer of GaAs having a thickness of 200 Å is formed on n-type silicon layer 25 at a growing temperature of 450° C.

Then an active layer 11 of gallium arsenide is subsequently formed on the buffer layer at a growing temperature of 750° C. After the above-mentioned hetero-epitaxial growth of gallium arsenide, active layer 11 is etched by a mesa-etching using a photolithography so as to form mesa shape having a flat top and steep sides, shown in FIG. 2 and a cross pattern illustrated in FIG. 1. In this etching process, active layer is separated from $SiO_2$ film 34 by a distance of 10–50 μm as shown by numerals 51 and 52 in FIG. 2. The volume ratio of an etching fluid used in this etching process is set as follows:

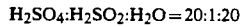

$H_2SO_4:H_2SO_2:H_2O = 20:1:20$

Figure 1:
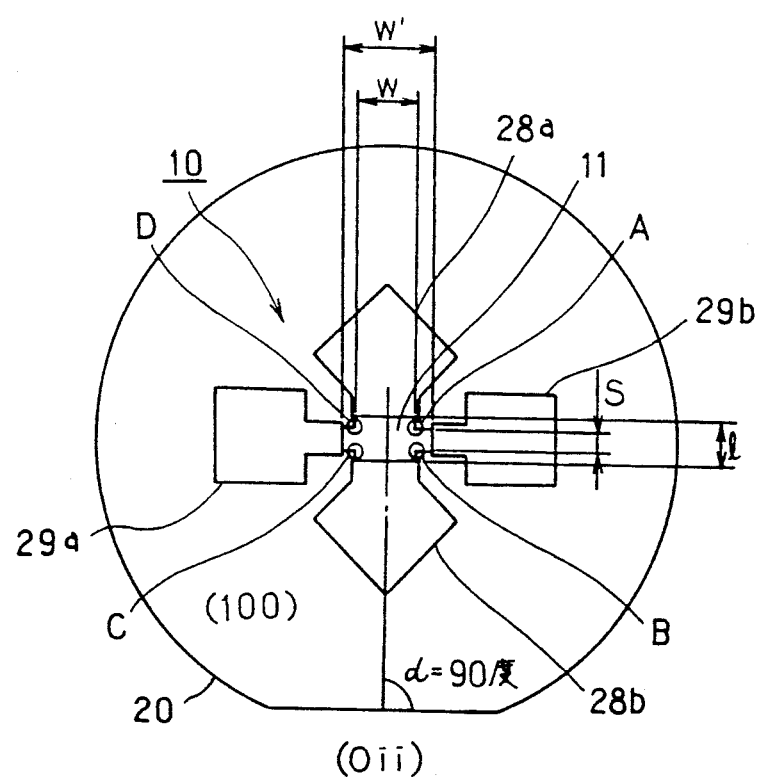
FIG. 1 is a plan view showing a relationship between a Hall-effect device of GaAs and a Si wafer in the present invention.

In FIG. 1, cross-shape active layer 11 comprises two pairs of convex portions extending in a vertical direction and in horizontal direction, respectively so that each pair crosses in the center of the active layer at a right angle. The vertical direction of active layer 11 is at a right angle with an orientation flat provided in the crystalline face $(\overline{011})$ of silicon wafer 20. The vertical convex portions are electrically connected with input terminals 28a and 28b so as to input electric current therein. The horizontal convex portions are electrically connected with output terminals 29a and 29b so as to output electric voltage therefrom. In the cross shape of active layer 11, a ratio of a length w' of the horizontal portions to a width w of the vertical portions is approximately 1.6, and a ratio of a length of the vertical portions to a width s of the horizontal portion is approximately 0.23.

After active layer 11 is formed in the above-mentioned manner, silicon nitride 60 shown in FIG. 2 is accumulated thereon by plasma CVD. Subsequently, accumulated silicon nitride 60 is clearly etched on the surface of silicon oxide film 34 by plasma etching using gas plasma of $CH_4$ and $O_2$. Then, ohmic electrodes, 15a and 15b are formed by vapor deposition of Au/Au-Ge. Finally, aforementioned input terminals 28a and 28b, output terminals 29a and 29b and ohmic electrodes 35 are formed by vapor deposition of aluminum and subsequently patterned by photolithography.

Figure 3:
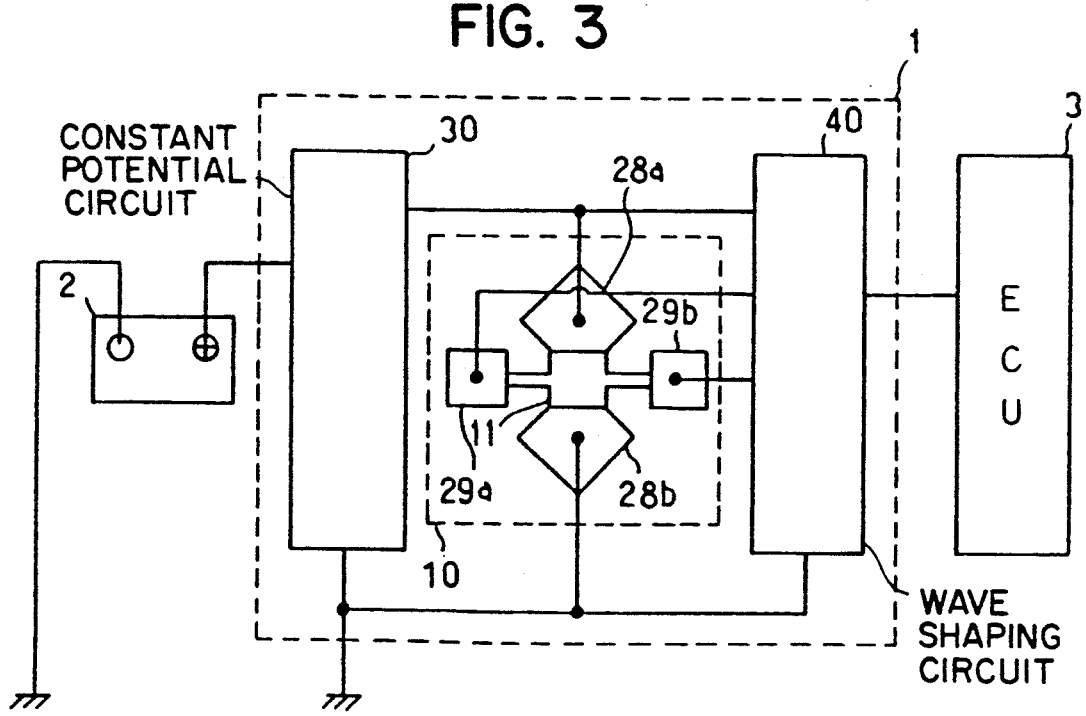
FIG. 3 is a schematic view showing a electric circuit using the Hall-effect device of the present invention.

With reference to FIG. 3, the electric circuit of the Hall-effect device 1 is explained below.

Hall-effect device 1 comprises constant-potential circuit 30, Hall-effect portion 10 and wave-shaping circuit 40. Both constant-potential circuit 30 and wave-shaping circuit 40 are comprised of pnp-transistors 31, npn-transistor 32, MOS-capacities and other elements as shown in FIG. 2. Constant-potential circuit 30 is connected to a power source, namely battery 2 and supplies a constant voltage to Hall-effect portion 10. More precisely, it is connected to input terminals 28a and 28b of Hall-effect portion 10 so as to supply a constant voltage to active layer 11. Output terminals 29a and 29b of Hall-effect portion 10 are connected to wave-shaping circuit 40 in order to output a detected signal corresponding to the strength of magnetic field which is detected by active layer 11. The detected signal is converted to a wave-shaped signal in wave-shaping circuit 40 and transferred to electronic control circuit 3.

In the above-mentioned embodiment, the configuration of active layer 11 is explained in more detail below.

For the purpose of preventing the occurrence of an unbalanced voltage in active layer 11, it is necessary to form active layer 11 into a symmetrical mesa shape by a proper etching technique. In order to meet this requirement, the inventors of the present invention have invented an appropriate etching fluid which is a mixture of sulfuric and hydrogen peroxide. According to their research, they recognized that an appropriate mesa can be obtained if the volume of sulfuric acid is higher than that of hydrogen peroxide.

However, when using this kind of etching fluid, the inventors found out that the etching velocity changed due to the crystalline face of gallium arsenide. Namely, the etching proceeds, in the order of the face (110), (111)B, (100) and (111)A. In this case, gallium is exposed on the face (111)A and arsenic is exposed on the face (111)B. Therefore etching active layer 11 of gallium arsenide by the above-mentioned etching fluid, causes a geometrical unbalance to appear in active layer 11 if the masking or patterning for forming active layer 11 is not properly arranged with regard to the crystalline face of silicon wafer 20. Accordingly, for the purpose of preventing such geometrical unbalance from occurring, active layer 11 is arranged so that one of the directions of two pairs of cross-shape active layer 11 is at a right angle with the crystalline face (011) of silicon wafer 20 in case of forming the gallium arsenide on the crystalline face of silicon wafer 20. This relationship between the position of active layer 11 and silicon wafer 20 is illustrated in FIG. 2.

Figure 4A:
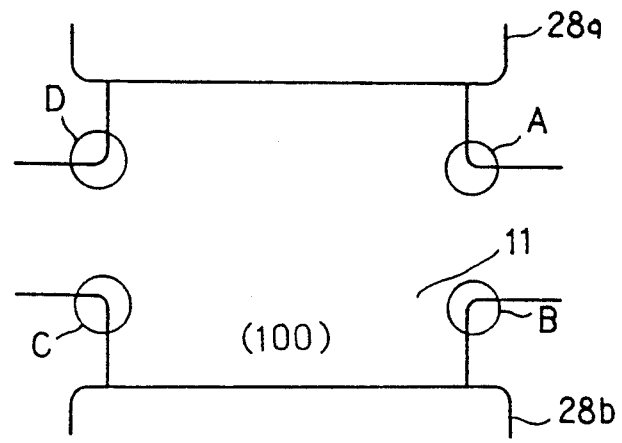
FIGS. 4(a) and (b) are plan views respectively showing the shapes of active layers when being etched at angles of α=90° and 45°
Figure 4B:
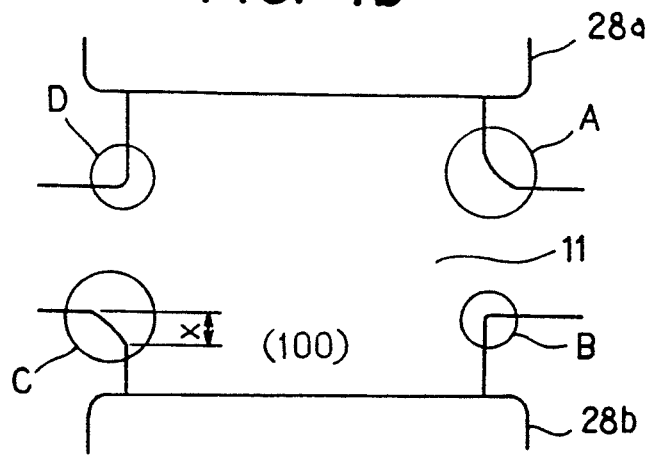
Figure 5:
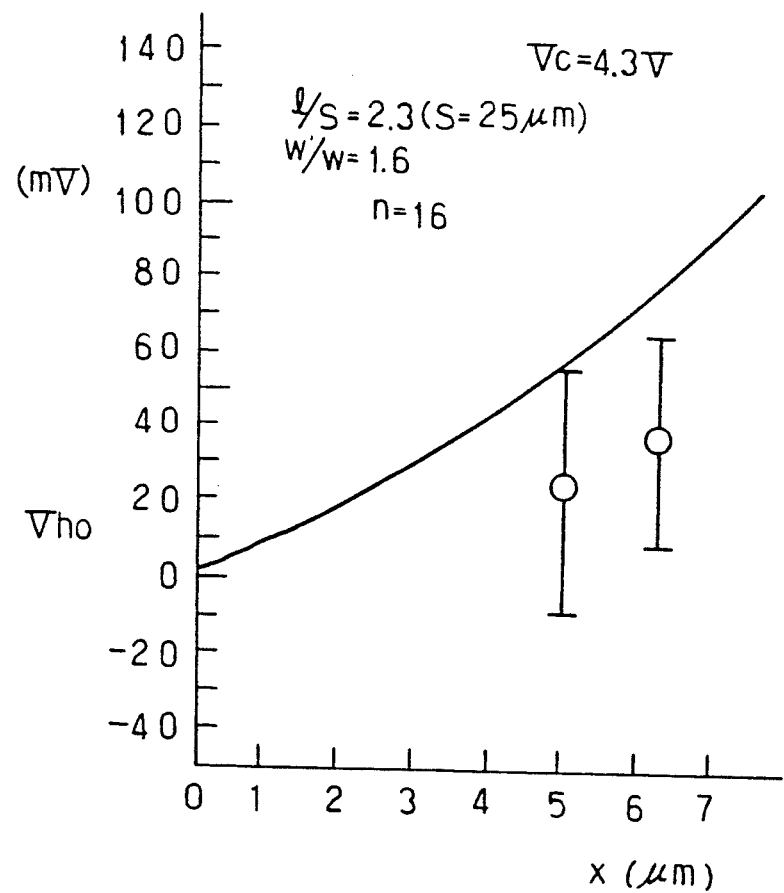
FIG. 5 is a graph showing a characteristics between a displacement value of crossing points of the active layer and unbalanced voltage.

If the angle "a" between the direction of the vertical convex portion and the crystalline face (011) of silicon wafer 20 is set at 45°, non-etched portions are left at the crossing portions "A" and "B" as shown in FIG. 4(b) because the crystalline face (111)A, which is etched slowly, appears at the crossing portions "A" and "C", and the crystalline face (111)B, which is etched faster than the face (111)A, appears at the crossing portions "B" and "D". The existence of these non-etched portions (x) causes the unbalanced distribution of the potential in active layer 11 and therefore unbalanced voltage "$V_{ho}$" as shown in FIG. 5.

Figure 6A:
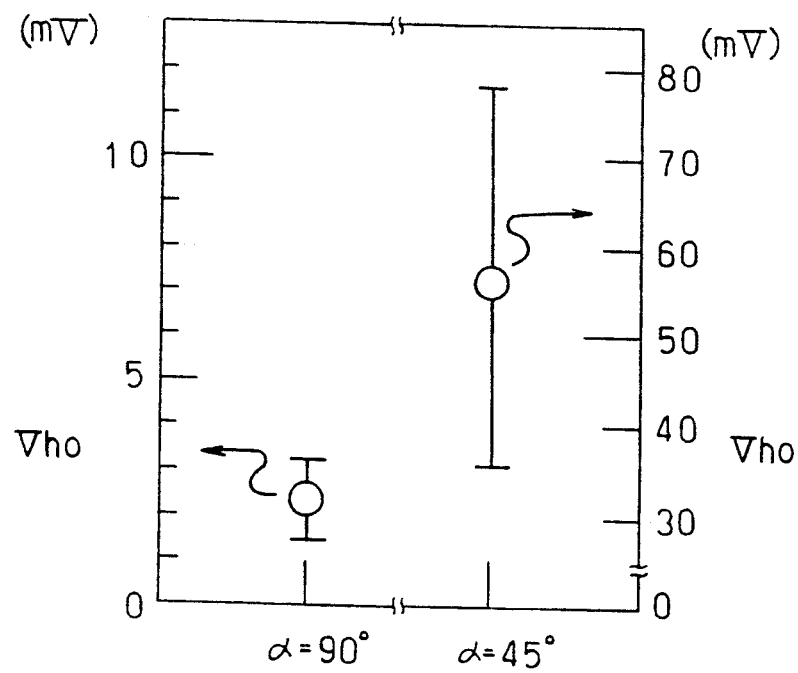
FIGS. 6(a) and (b) are graphs showing a relationship between the angle α and unbalanced voltage $V_{ho}$.
Figure 6B:
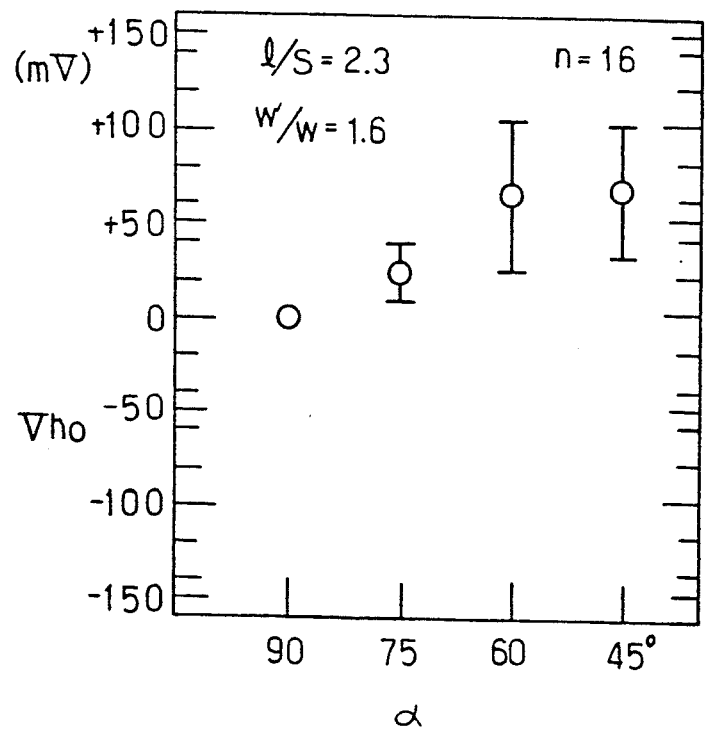

However, if the angle "$\alpha$" is set at 90°, the geometrical unbalance does not appear in crossing portions in active layer 11 because all crystalline faces having the same etching velocity appear at crossing portions "A", "B", "C", and "D", and they are all therefore etched at the same speed as shown in FIG. 4(a). Namely, if all crystalline faces exposed at crossing portions "A", "B", "C" and "D" are completely and properly etched, no unbalanced voltage occurs in active layer 11 as shown in FIG. 5. In FIGS. 6 (a) and (b), in case that the angle "$\alpha$" is 90°, the unbalanced voltage "$V_{ho}$" is extremely small, and below 3.5 mv. When the angle "$\alpha$" is 45°, the unbalanced voltage $V_{ho}$ may reach above 60 mV.

Figure 7:
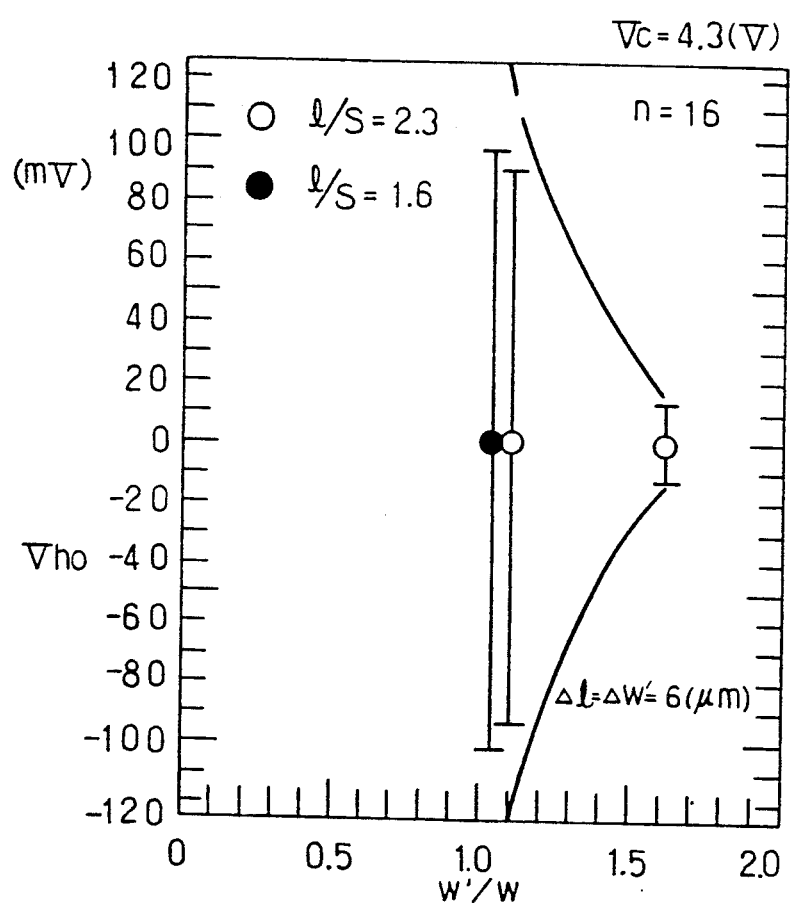
FIG. 7 is a graph showing a relationship between a ratio w'/w and unbalanced voltage $V_{ho}$.
Figure 8:
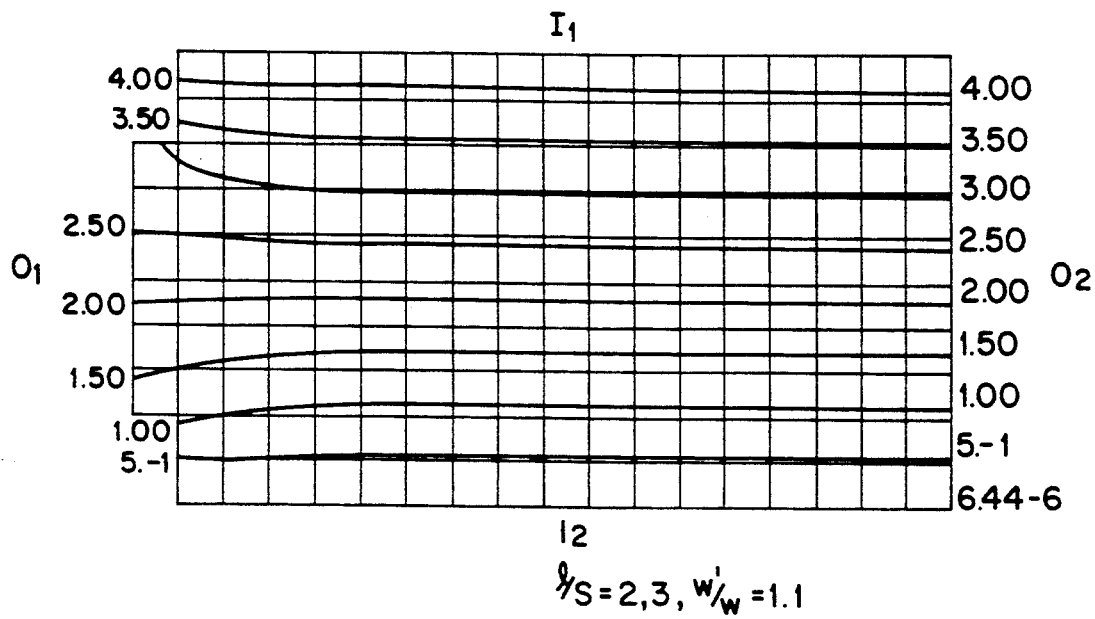
FIG. 8 is a graph showing a result of an analysis of electric field at the ratio of w'/w=1.1.

According to the above-described embodiment, the ratio of a length "w'" of the horizontal portions to a width "w" of the vertical portions is set at approximately 1.6 in cross-shape active layer 11. The reason of this ratio is explained below with reference to FIG. 7, FIG. 8, and FIG. 9. FIG. 7 indicates that the unbalanced voltage "$V_{ho}$" decreases as the ratio of "w'/w" increases. In FIG. 7, the circles denotes the average values of data which were measured by the inventors of the present invention. FIG. 8 shows the result of the electric field analysis in active layer 11 in case that the ratio of w'/w is 1.1, which is fairly small. According to the results, the unbalanced voltage is 223 mV which is extremely high. In this case, the unbalanced voltage "$V_{ho}$" represents the difference between a voltage "$V_{01}$" of output terminal 29a and a voltage "$V_{02}$" of output terminal 29b when the magnetic field is zero.

Figure 9:
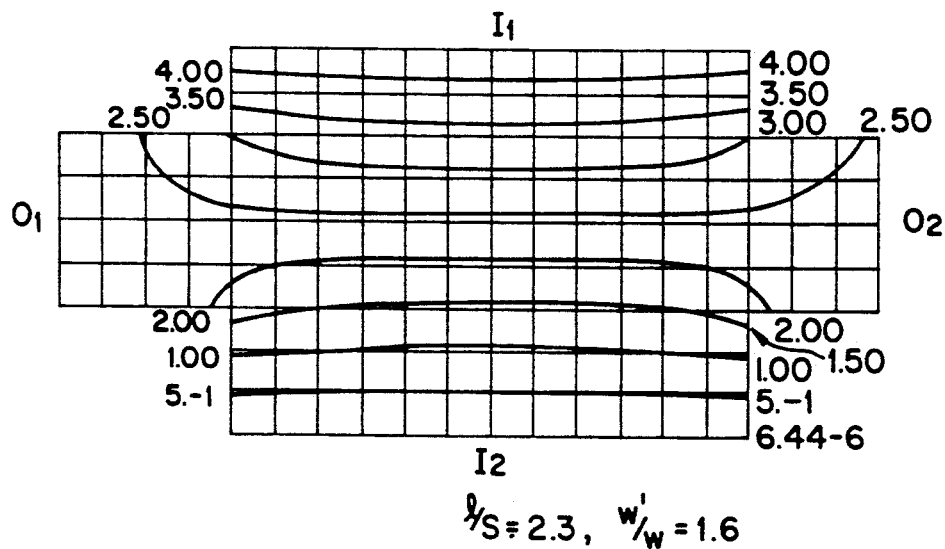
FIG. 9 is a graph showing a result of an analysis of electric field at the ratio of w'/w=1.6.

Therefore, in case that the ratio of w'/w is small, a geometrical unbalance, which occurs by an improper masking or patterning, has a great influence on the difference between the voltage "$V_{01}$" and the voltage "$V_{02}$", causing the unbalanced voltage $\mp V_{ho}$". As opposed to FIG. 8, in case that the ratio of w'/w is set at 1.6 as shown in FIG. 9, the unbalanced voltage "$V_{ho}$" decreases to 2.5 mV even when active layer 11 loses its symmetry in certain degree. Namely, the geometrical unbalance does not have a great influence on the unbalanced voltage "$V_{ho}$" because the difference between the voltage "$V_{01}$" and the voltage "$V_{02}$" is small in this case.

Figure 10A:
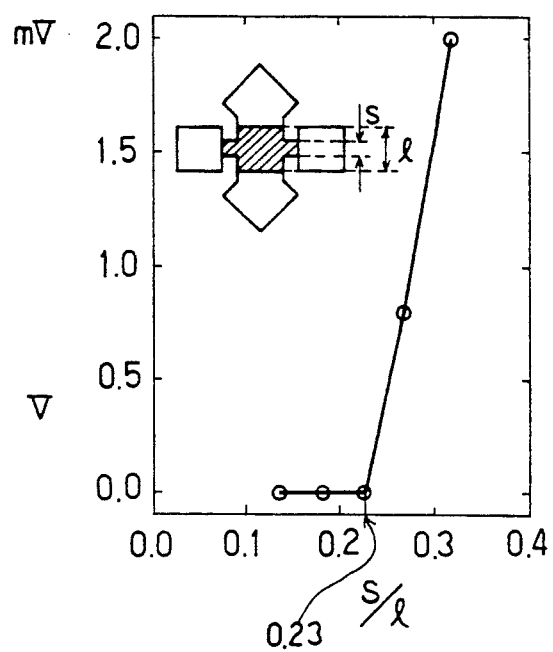
FIG. 10(a) is a graph showing a relationship between a ration s/l and unbalanced voltage $V_{ho}$.
Figure 10B:
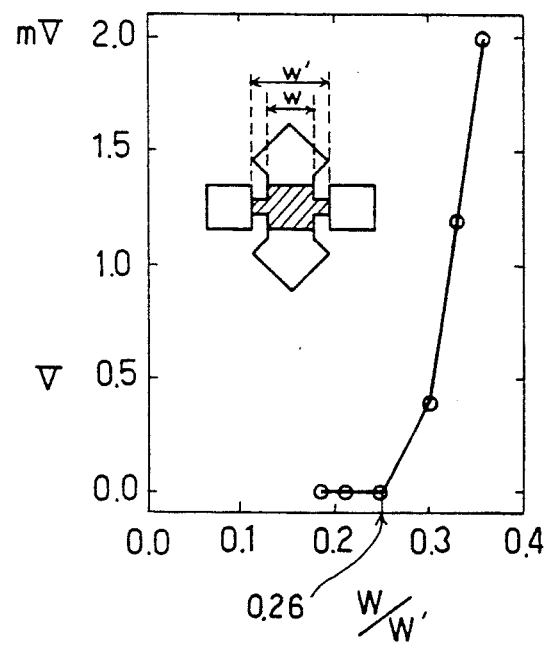
FIG. 10(b) is a graph showing relationship between a ratio w/w' and unbalanced voltage $V_{ho}$.

According to a further investigation by the inventors of the present invention, it was determined that the unbalanced voltage "$V_{ho}$" can be zero if a ratio of w/w' or a ratio of s/l lowers to a critical point indicated in FIG. 10(a) and FIG. 10(b). In FIG. 10 10(a), when the ratio of s/l is 0.23, the unbalanced voltage "$V_{ho}$" becomes zero. In FIG. 10(b), when the ratio of w/w' is 0.26, the unbalanced voltage "$V_{ho}$" becomes zero.

Accordingly, if the active layer 11 is designed and formed so that a ratio of w/w' is equal to or less than 0.26 or that a ratio of s/l is equal to or less than 0.23, the unbalanced voltage "$V_{ho}+$ does not theoretically occur, even when there is a little geometrical unbalance.

The present invention is not limited to the above-described embodiment and other various modifications can be applied as described hereinafter.

The active layer 11 can be formed so that the direction of one pair of convex portions thereof is at right angle "$\alpha$" with an orientation flat provided in the crystalline face $(0\bar{1}1)$ or $(01\bar{1})$ of silicon wafer 20. In this case, the angle "$\alpha$" can be $90°\pm\beta°$ provided the following condition is satisfied:

$\tan \beta = \frac{1}{3}$ and, $\beta$ corresponds to an angle at which said first pair of convex portions is formed so that said direction thereof to said orientation flat of said wafer is set at an angle of $90°\pm\beta°$ in the etching process.

The etching fluid is not limited to sulfuric acid and other etching technique such as dry-etching can be applied.

The active layer can be formed by using other Group III and V element compound semiconductor such as InP or InAs.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. A semiconductor device for detecting a strength of a magnetic field, comprising:
   a semiconductor wafer;
   an active layer of a Group III and V element compound semiconductor formed on said semiconductor wafer, said active layer comprising:
   a) a first pair of convex portions of a generally convex shape, a first convex portion of said first pair being opposite to a second convex portion thereof and connected thereto at a connection portion;
   b) a second pair of convex portions of a generally convex shape, a third convex portion of said second pair being opposite to a fourth convex portion thereof and connected thereto at a connection portion, said first and second pairs arranged so that said first pair of convex portions crosses said second pair of convex portions; and
   c) a crossing portion having a same crystalline surface thereof exposed at all points where said first pair of convex portions crosses said second pair of convex portions;
   a pair of input terminals each of which is electrically connected to each convex portion of said first pair and adapted to input electric current to said each convex portion of said first pair; and
   a pair of output terminals each of which is electrically connected to each convex portion of said second pair and connected to output a voltage generated in said active layer in response to a magnetic field strength,
   wherein said first pair of convex portions and said second pair of convex portions are formed so that a ratio of a width of said connection portion of said second pair to a length of said connection portion of said first pair is equal to or less than 0.23.

2. A semiconductor device for detecting a strength of a magnetic field, comprising:
   a semiconductor wafer having a face-orientation of (100);
   an active layer of a Group III and V element compound semiconductor formed on said semiconductor wafer and having a face-orientation (100),
   said active layer comprising:
   a) a first pair of convex portions of a generally convex shape, a first convex portion of said first pair being opposite to a second convex portion thereof and connected thereto at a connection portion so that a direction thereof to one of crystalline-faces $(0\bar{1}1)$, $(0\bar{1}1)$ and $(01\bar{1})$ of said wafer is set at an angle of $90°\pm\beta°$, $\tan\beta=\frac{1}{3}$; and b) a second pair of convex portions of a generally convex shape, a third convex portion of said second pair being opposite to a fourth convex portion thereof and connected thereto at a connection portion said first and second convex portions cross said third and fourth portions, at least one of said convex portions including at least one mesa-shaped section;

c) a crossing portion having a same type crystalline surface thereof exposed at all points where said first pair of convex portions cross said second pair of convex portions;

a pair of input terminals each of which is electrically connected to each convex portion of one of said first pair and second pair and adapted to input electric current to said each convex portion of said first pair; and a pair of output terminals each of which is electrically connected to each convex portion of the other of said first pair and said second pair so as to output voltage generated in said active layer in response to a magnetic field strength.

3. A semiconductor device according to claim 2, wherein said first pair of convex portions crosses said second pair of convex portions with a substantially right angle.

4. A semiconductor device according to claim 2, wherein said second pair of convex portions has at least one mesa-shaped section.

5. A semiconductor device according to claim 2, wherein a ratio of a length of said connection portion of said second pair to a width of said connection portion said first pair is equal to or less than 0.23.

6. A semiconductor device according to claim 2, wherein said first pair of convex portions and said second pair of convex portions are formed so that a ratio of a width (w) of said convex portion of first pair to a length (w') of said second pair is equal or less than 0.26.

7. A semiconductor device according to claim 2, wherein said semiconductor wafer is made of silicon.

8. A semiconductor device according to claim 2, wherein said active layer is made of gallium arsenide.

9. A semiconductor device according to claim 1, wherein said first pair of convex portions and said second pair of convex portions are formed so that a ratio of a width (w) of said convex portion of said first pair to a length (w') of said second pair is equal or less than 0.26.

10. A semiconductor device according to claim 1, wherein said semiconductor wafer is made of silicon.

11. A semiconductor device according to claim 1, wherein said active layer is made of gallium arsenide.

12. A semiconductor device according to claim 1, wherein said first pair of convex portions crosses said second pair of convex portions at a right angle.

13. A semiconductor device according to claim 11, wherein said active layer has a face-orientation (100), and one of said first pair and second pair is formed so that a direction thereof to one of crystalline-faces (011), (011), (011), of said wafer is set at an angle of $90°\pm\beta°$, $\tan\beta=\frac{1}{3}$.

* * * * *